(12) United States Patent
Fukushima

(10) Patent No.: US 9,000,780 B2
(45) Date of Patent: Apr. 7, 2015

(54) POSITION DETECTING SENSOR, POSITION DETECTING DEVICE, AND POSITION DETECTING METHOD

(75) Inventor: Yasuyuki Fukushima, Saitama (JP)

(73) Assignee: Wacom Co., Ltd., Saitama (JP)

( * ) Notice: Subject to any disclaimer, the term of this patent is extended or adjusted under 35 U.S.C. 154(b) by 275 days.

(21) Appl. No.: 13/467,721

(22) Filed: May 9, 2012

(65) Prior Publication Data

US 2013/0009653 A1      Jan. 10, 2013

(30) Foreign Application Priority Data

Jul. 8, 2011   (JP) .................................. 2011-152073

(51) Int. Cl.
- G01R 27/26   (2006.01)
- G06F 3/044   (2006.01)
- G01D 5/24    (2006.01)

(52) U.S. Cl.
CPC ............ *G06F 3/044* (2013.01); *G01R 27/2605* (2013.01); *G01R 27/26* (2013.01); *G01D 5/24* (2013.01)

(58) Field of Classification Search
CPC ............................ G06F 3/044; G01R 27/2605
USPC .......................................................... 324/679
See application file for complete search history.

(56) References Cited

U.S. PATENT DOCUMENTS

| | | | |
|---|---|---|---|
| 5,905,489 A | 5/1999 | Takahama et al. | |
| 6,483,498 B1 * | 11/2002 | Colgan et al. | 345/173 |
| 6,730,863 B1 * | 5/2004 | Gerpheide et al. | 178/18.02 |
| 7,078,918 B2 * | 7/2006 | Umeda et al. | 324/679 |
| 7,924,029 B2 * | 4/2011 | Reynolds et al. | 324/672 |
| 8,395,371 B2 * | 3/2013 | Govil | 324/76.39 |
| 8,451,234 B2 * | 5/2013 | Sato et al. | 345/173 |
| 8,466,858 B2 * | 6/2013 | Govil | 345/85 |
| 2005/0219222 A1 * | 10/2005 | Johnson et al. | 345/173 |
| 2009/0194341 A1 * | 8/2009 | Nousiainen | 178/18.01 |
| 2009/0201242 A1 * | 8/2009 | Govil | 345/98 |
| 2010/0107770 A1 * | 5/2010 | Serban et al. | 73/718 |
| 2010/0134121 A1 * | 6/2010 | Sato et al. | 324/538 |
| 2010/0301879 A1 * | 12/2010 | Philipp | 324/679 |
| 2011/0018560 A1 * | 1/2011 | Kurashima | 324/679 |

FOREIGN PATENT DOCUMENTS

| | | |
|---|---|---|
| JP | 9222947 A | 8/1997 |
| JP | 10161795 A | 6/1998 |
| JP | 2003022158 A | 1/2003 |
| JP | 2009265759 A | 11/2009 |
| JP | 2010079791 A | 4/2010 |

* cited by examiner

*Primary Examiner* — Jermele M Hollington
*Assistant Examiner* — Christopher McAndrew
(74) *Attorney, Agent, or Firm* — Seed IP Law Group PLLC

(57) ABSTRACT

A position detecting sensor is configured by providing a dielectric member having flexibility between first conductors and second conductors and providing spacers for separating the first conductors or the second conductors from the dielectric member by a determined gap. When a pressing force is applied by an indicator (e.g., a finger or a pen) on the position detecting sensor, the first conductor and the second conductor come to abut each other, with the dielectric member interposed therebetween. Further, an abutting area (contact area) between the dielectric member and the conductor changes (e.g., increases) according to the pressing force applied by the indicator. Thus, capacitance of the capacitor formed between the first conductor and the second conductor is largely changed, to allow detection of a position indicated by the indicator as well as the pressing force applied at the indicated position with high sensitivity and high accuracy.

19 Claims, 10 Drawing Sheets

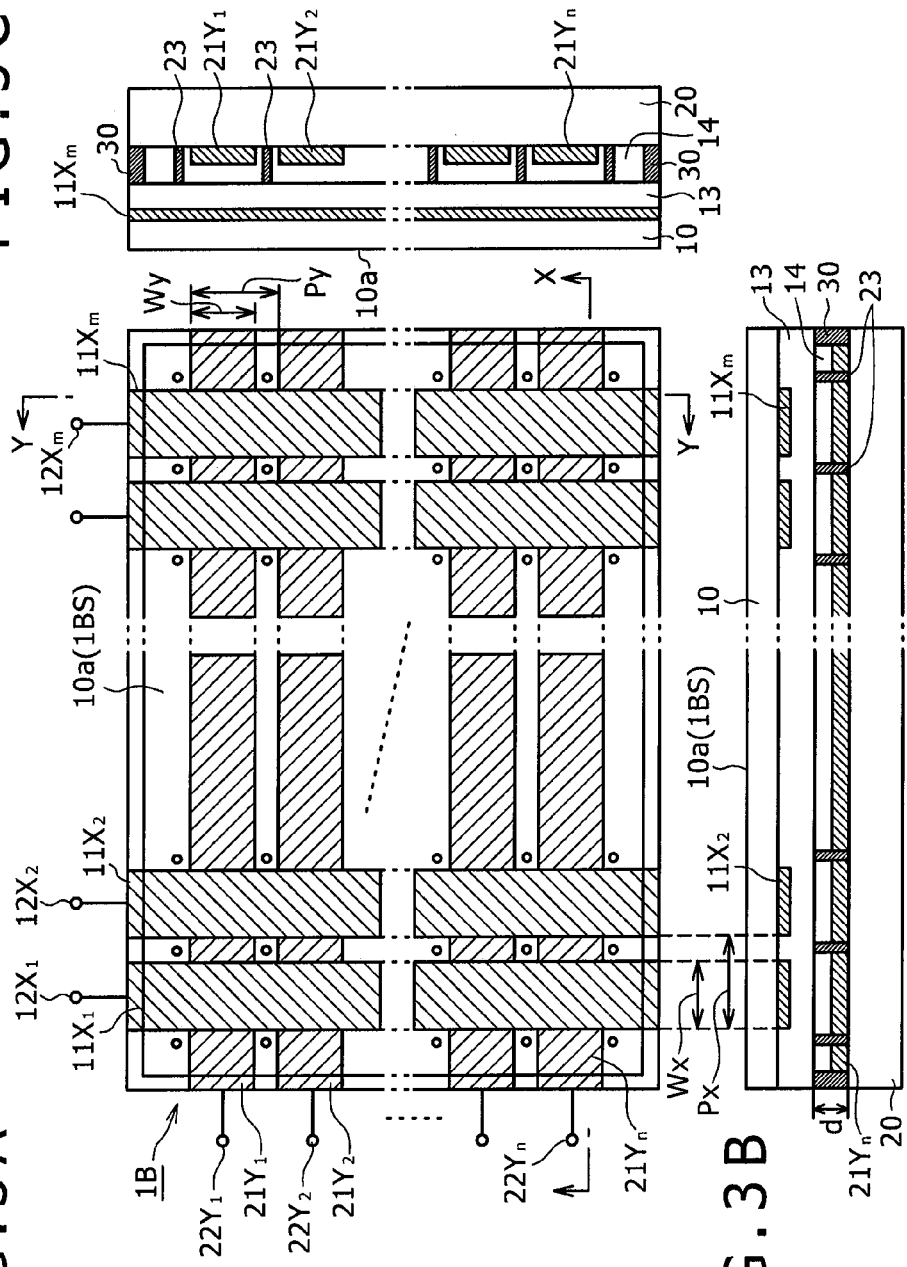

POSITION DETECTING SENSOR, POSITION DETECTING DEVICE, AND POSITION DETECTING METHOD

CROSS-REFERENCE TO RELATED APPLICATION

The present application claims priority under 35 U.S.C. 119(a) of Japanese Application No. 2011-152073, filed Jul. 8, 2011, the entire content of which is incorporated herein by reference.

BACKGROUND

1. Technical Field

This invention relates to a position detecting sensor that detects a position indicated by an indicator by detecting a change in the capacitance at the position indicated by the indicator, a position detecting device including this position detecting sensor, and a position detecting method used in these sensor and device.

2. Description of the Related Art

In recent years, indicator-detecting devices that utilize a capacitive sensing system as the system for detecting a position of an indicator used on a touch panel etc. have been vigorously developed. There are two types of capacitive sensing system, the surface type (Surface Capacitive Type) and the projected type (Projected Capacitive Type) systems. In both systems, a change in the capacitive coupling state between the sensor electrode and the indicator (e.g., finger, capacitive pen, etc.) is detected to detect a position of the indicator.

For example, in patent document 1 (Japanese Patent Laid-open No. 2009-265759), an indicator-detecting device that utilizes the capacitive sensing system of the surface type is introduced. An indicator-detecting device that utilizes the capacitive sensing system of the projected type may be configured by forming plural electrodes in a predetermined pattern on, e.g., a transparent substrate such as glass or a transparent film. The indicator-detecting device of the projected type detects a change in the capacitive coupling state between the indicator and the electrode when the indicator comes close to the electrode. Examples of the indicator-detecting device that utilizes the capacitive sensing system of the projected type are disclosed in, e.g., patent document 2 (Japanese Patent Laid-open No. 2003-22158), patent document 3 (Japanese Patent Laid-open No. Hei 9-222947), and patent document 4 (Japanese Patent Laid-open No. Hei 10-161795).

Furthermore, there has been proposed an indicator-detecting device that utilizes a system called the cross-point capacitive sensing system, which has been developed from the capacitive sensing system of the projected type.

FIG. 13 shows the schematic configuration of the sensor part in the indicator-detecting device that utilizes the cross-point capacitive sensing system. The indicator-detecting device that utilizes the cross-point capacitive sensing system is configured as a multi-touch-enabled device capable of simultaneously detecting plural indicators such as plural fingers.

In the position detecting sensor of this indicator-detecting device that utilizes the cross-point capacitive sensing system, plural upper electrodes Ex and plural lower electrodes Ey are disposed perpendicularly to each other in, e.g., the X-axis direction (horizontal direction) and the Y-axis direction (vertical direction) of the indication input surface. In this case, a predetermined capacitance Co (fixed capacitance) is formed at the overlapping part (cross-point) between the upper electrode Ex and the lower electrode Ey. Furthermore, at a position where an indicator fg such as a finger of the user is brought close to or into contact with the indication input surface, a capacitance Cf is formed between the electrodes Ex and Ey at this position and the indicator fg. In addition, the indicator fg such as a finger is connected through the human body to the ground via a predetermined capacitance Cg. As a result, due to the capacitances Cf and Cg, the electric charge between the upper electrode Ex and the lower electrode Ey changes at the position of this indicator fg. In the conventional indicator-detecting device that utilizes the cross-point capacitive sensing system, this change in the electric charge is detected and, therefore, a position indicated by the indicator on the indication input surface is identified.

In patent document 5 (Japanese Patent Laid-open No. 2010-79791), a capacitive-type input device capable of detecting an indicator other than the finger or a capacitive pen is disclosed. As shown in FIG. 14A, the indicator-detecting sensor of the input device disclosed in patent document 5 includes a first substrate 2, a flexible second substrate 3 opposed to the first substrate 2 with an air layer 4 interposed therebetween, a first electrode 5 formed over almost the entire surface of the first substrate 2 that is facing the second substrate 3, and plural second electrodes 6 formed on the surface of the second substrate 3 that is facing the first substrate 2.

In the indicator-detecting sensor of the input device disclosed in patent document 5, when the second substrate 3 is not pressed by the indicator, a capacitance C1 is formed between each of the plural second electrodes 6 and the first electrode 5 as shown in FIG. 14A.

When the second substrate 3 is pressed toward the first substrate 2 by the indicator, the second substrate 3 is bent toward the first substrate 2 at the pressed position, as shown by an arrow in FIG. 14B, because the second substrate 3 has flexibility. Thus, the distance between the first substrate 2 and the second substrate 3 becomes shorter and the capacitance formed by the first electrode 5 and the second electrode 6 at this part becomes C2, which is larger than the above-described C1. If further pressing is performed as shown by an arrow in FIG. 14C, the second electrode 6 comes into contact with the first electrode 5 to be in a conductive state.

In the input device of patent document 5, when the capacitance formed by the above-described first electrode 5 and second electrode 6 is detected to be larger than C1, the pressing input by the indicator to the second substrate 3 (pressed position) can be detected. In addition, it is disclosed that the pressing input at the pressed position can also be determined by detecting that the second electrode 6 comes into contact with the first electrode 5 to be in a conductive state.

PRIOR ART DOCUMENTS

Patent Documents

Patent Document 1
Japanese Patent Laid-open No. 2009-265759
Patent Document 2
Japanese Patent Laid-open No. 2003-22158
Patent Document 3
Japanese Patent Laid-open No. Hei 9-222947
Patent Document 4
Japanese Patent Laid-open No. Hei 10-161795
Patent Document 5
Japanese Patent Laid-open No. 2010-79791

BRIEF SUMMARY

Problems to be Solved by the Invention

In the indicator-detecting sensor that utilizes the cross-point capacitive sensing system described above in reference to FIG. 13, the distance between the electrodes Ex and Ey is physically fixed and the capacitance Co between the electrodes at the cross-point is also a fixed value and, e.g., 0.5 pF. When a finger is brought close to or into contact with the electrode, the value of the capacitance Co between the electrode Ex and the electrode Ey changes due to the influence of the capacitance possessed by the human body. Thus, the finger as the indicator is detected by detecting this change. That is, the indicator-detecting sensor that utilizes the cross-point capacitive sensing system detects the degree of the influence when an indicator having predetermined capacitance, such as the human body, comes close to the sensor.

However, the change in the capacitance at the cross-point when the finger is brought close is very small. It is only about 0.05 pF whereas the value of the capacitance Co between the electrodes Ex and Ey is, e.g., 0.5 pF. Thus, the margin of the detection output of the indicator against noise is very limited and it is difficult to detect the indicator such as a finger with high sensitivity, let alone to detect the pressing force of the indicator such as a finger.

Furthermore, because the detecting method of the cross-point capacitive sensing system is a system in which an influence is given to the capacitance between the electrodes by bringing an electrical conductor such as a finger close to the cross-point (mutual capacitance), detection is possible only with an electrical conductor, such as the human body. Thus, problems arise that the sensitivity changes depending on how dry the finger is or that the sensor does not function when a user is wearing a rubber glove, for example.

In the case of the invention of patent document 5, such restrictions on the indicator are absent and detection of the pressed-indicated position is possible even when a user wears a rubber glove or the like. However, in the detecting method of patent document 5, although the method is based on the capacitive type, the pressing input is finally determined by detecting the state in which the second electrode 6 is brought into contact with and electrically connected to the first electrode 5. Therefore, although the position pressed by the indicator can be detected, it is difficult to detect the pressing force of the indicator to the second substrate 3 with high accuracy.

Specifically, the second substrate 3 bends depending on the pressing force of the indicator to the second substrate 3 and, therefore, the capacitance between the first electrode 5 and the second electrode 6 becomes larger in inverse proportion to the shortened distance until the second electrode 6 comes into contact with the first electrode 5. However, when the second electrode 6 comes into contact with the first electrode 5, both are electrically connected to each other. Thus, the capacitance between the first electrode 5 and the second electrode 6 becomes zero.

Thus, in the indicator sensor of patent document 5, the pressing force applied to the second substrate 3 by the indicator can be detected, based on a change in the capacitance, until the second electrode 6 comes into contact with the first electrode 5.

In view of the above, according to one aspect of the present invention, a position detecting sensor that utilizes the capacitive sensing system is provided, which is capable of detecting an indicated position by an indicator merely by monitoring a change in capacitance and is also capable of detecting the pressing force applied at the indicated position with high sensitivity and high accuracy. According to further aspects of the present invention, a corresponding position detecting device and a corresponding position detecting method are also provided.

Means for Solving the Problems

The position detecting sensor according to one embodiment of the invention is a position detecting sensor based on a capacitive sensing system. The position detecting sensor includes a plurality of first conductors disposed in a first direction and a plurality of second conductors disposed in a direction that intersects the first direction. The position detecting sensor detects a position indicated by an indicator by detecting a change in a capacitance formed between the first conductor and the second conductor based on a position indication operation by the indicator. The position detecting sensor is characterized in that the plurality of first conductors have flexibility, a dielectric member having flexibility intervenes between the plurality of first conductors and the plurality of second conductors, and one surface of the dielectric member having flexibility abuts the plurality of first conductors or the plurality of second conductors. One or more spacers are provided, to define a determined gap between, one surface of the dielectric member whose other surface abuts the plurality of second conductors or the plurality of first conductors, and the other of the plurality of first conductors or the plurality of second conductors (to which the dielectric member does not abut) that face the dielectric member. The abutting (contact) area between the surface of the dielectric member having flexibility and the plurality of second conductors or the plurality of first conductors that face the surface is changed when the plurality of first conductors are pressed in connection with a position indication operation of the indicator. The change in the abutting area causes a change in the capacitance between the plurality of first conductors and the plurality of second conductors with the flexible dielectric member interposed therebetween.

According to the position detecting sensor of the present embodiment, the dielectric member having flexibility intervenes between the plurality of first conductors and the plurality of second conductors in the position detecting sensor. The position detecting sensor has a configuration in which one surface of the dielectric member is made to abut the plurality of first conductors or the plurality of second conductors and the other surface of the dielectric member faces, with a determined gap from, the other of the plurality of second conductors or the plurality of first conductors, wherein the determined gap is defined by the spacer(s).

When the position detecting sensor is pressed by the indicator in the direction from the side of the plurality of first conductors to the side of the plurality of second conductors, the abutting area between the dielectric member having flexibility and the plurality of second conductors or the plurality of first conductors, which are so disposed to face, with a determined gap from, the dielectric member changes. That is, the abutting area of the dielectric member having flexibility with the conductor(s) (electrode(s)) changes based on the pressing operation by the indicator. As a result, the capacitance between the first conductor and the second conductor can be greatly changed according to the pressing operation by the indicator.

When the abutting area of the dielectric member having flexibility with the electrode is changed according to the pressing operation by the indicator in this manner, the capacitance between the first conductor and the second conductor can be greatly changed. By detecting this change, a position indicated by the indicator can be detected with high sensitivity. Furthermore, what degree of force (pressing force) is applied can be detected based on the amount of change in the capacitance. In this manner, when the abutting area of the dielectric member having flexibility with the electrode is changed according to the pressing operation by the indicator, the capacitance between the first conductor and the second conductor can be greatly changed and the indicated position can be detected with high sensitivity. In addition, the force (pressing force) applied to the indicated position can be detected with high sensitivity and high accuracy.

Effects of the Invention

In the embodiment of the invention described above, according to the pressing operation by the indicator, a large change in the capacitance is caused by bringing the first conductor and the second conductor close to each other, with the thickness of the dielectric member interposed therebetween, and changing the abutting area of the dielectric member having flexibility with the conductor. Thus, a position indicated by the indicator can be detected with high sensitivity. In addition, the force (pressing force) applied to the indicated position can be detected with high sensitivity and high accuracy.

BRIEF DESCRIPTION OF THE SEVERAL VIEWS OF THE DRAWINGS

FIGS. 3A to 3C are diagrams illustrating a configuration example of a position detecting sensor (1B) of the first embodiment.

DETAILED DESCRIPTION

Embodiments of a position detecting sensor, a position detecting device, and a position detecting method according to various embodiments of the present invention will be described below with reference to the drawings. In the embodiments described below, explanation is provided by taking as an example the case in which the invention is applied to a display function-equipped apparatus, called a display function-equipped tablet device, a tablet-type information terminal, or a pad-type information terminal.

First Embodiment

Schematic Configuration of a Display Function-Equipped Apparatus (1)

Figure 1:
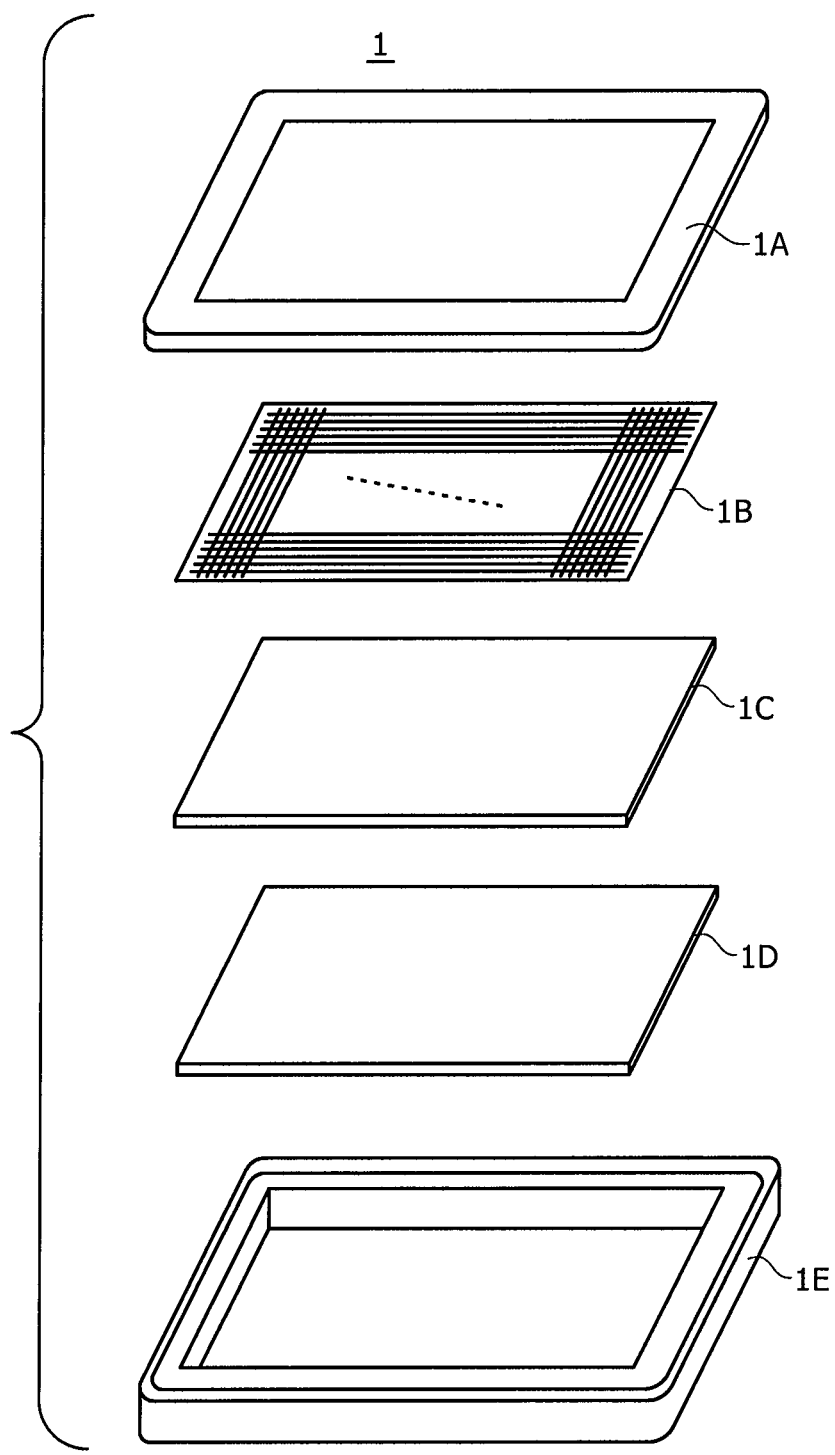
FIG. 1 is an exploded perspective view of the configuration of a display function-equipped apparatus of a first embodiment.

FIG. 1 is an exploded perspective view that outlines a configuration of a display function-equipped apparatus 1 according to a first embodiment. As shown in FIG. 1, in the display function-equipped apparatus 1, a motherboard 1D is housed at the lowermost layer in a chassis 1E, and a liquid crystal display (LCD) 1C is provided thereon in such a manner that the display screen is oriented toward the upper side (toward the side of a front panel 1A). A position detecting sensor 1B is provided on the display screen side of the LCD 1C. Furthermore, the front panel 1A is provided on the upper side of the position detecting sensor 1B, and all of the elements 1D, 1C, and 1B are housed and held in the chassis 1E.

In the motherboard 1D, various circuits are formed, such as a communications circuit, a control circuit for the LCD 1C, a signal supply circuit to supply a signal to the position detecting sensor 1B, and a signal receiving circuit to receive a signal from the position detecting sensor 1B to thereby detect an indicated position, and so forth. The LCD 1C is a display for realizing the display function of the display function-equipped apparatus 1. The position detecting sensor 1B is configured, by applying various embodiments of the invention thereto, and functions to receive various indication inputs (operation inputs) from the user.

As described above, the display screen of the LCD 1C may be viewed through the position detecting sensor 1B. Thus, the position detecting sensor 1B is so configured as to have optical permeability (transparency). This allows the user to make various indication inputs through the position detecting sensor 1B while viewing information displayed on the LCD 1C from the side of the front panel 1A of the display function-equipped apparatus 1.

Although not shown in FIG. 1, the LCD 1C and the position detecting sensor 1B are each connected to the corresponding circuit part in the motherboard 1D. Furthermore, also as described in detail later, a position detecting device is configured of the position detecting sensor 1B, and of the signal supply circuit and the signal receiving circuit provided in the motherboard 1D. The display function-equipped apparatus 1 is so realized that its exterior size is, in terms of the paper size, the A5 format size, the B5 format size, or the A4 format size, for example.

Configuration Examples of a Position Detecting Device

Figure 2:
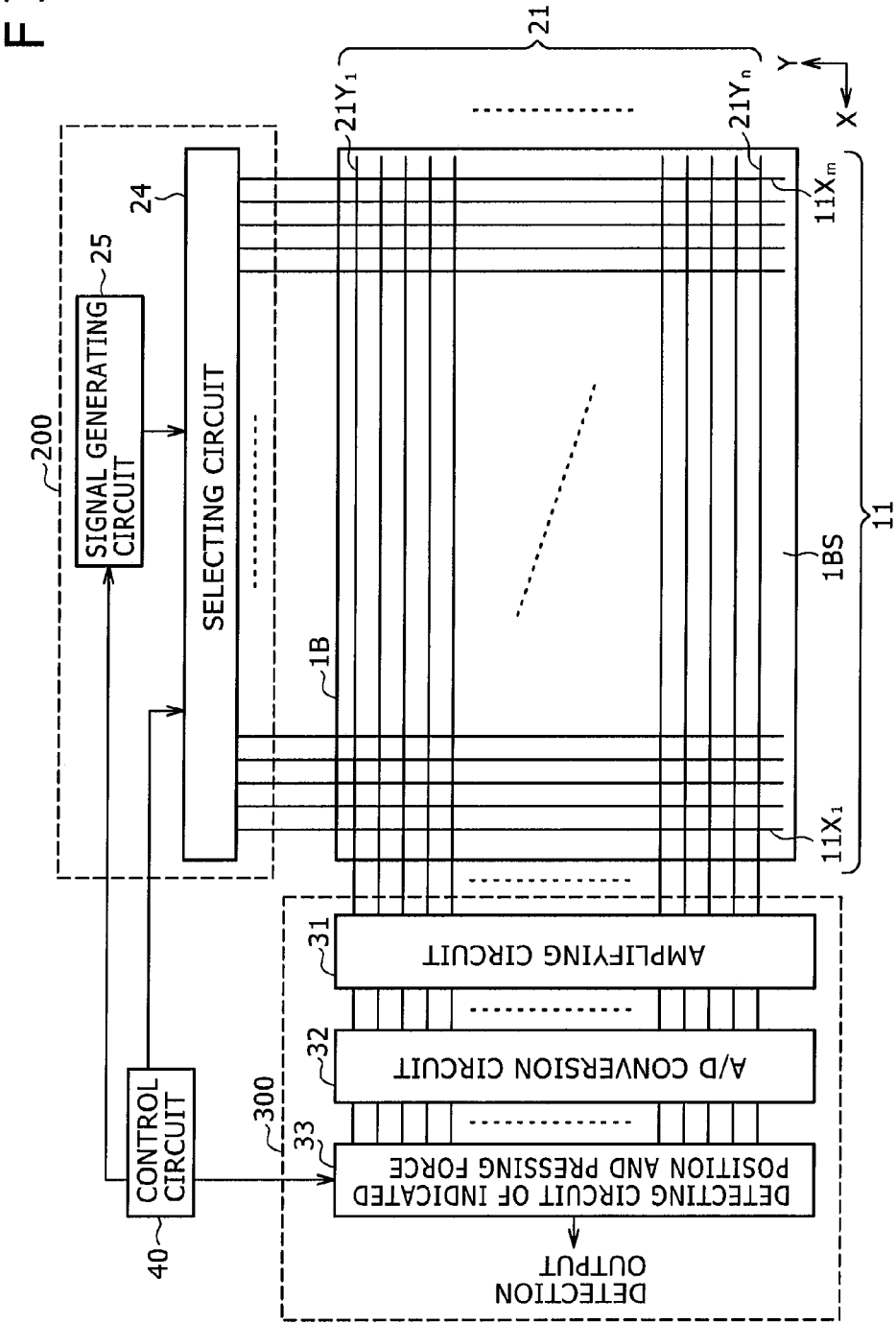
FIG. 2 is a block diagram of a configuration example of a position detecting device of the first embodiment.

Next, a configuration example of the position detecting device including the position detecting sensor 1B will be described. FIG. 2 is a block diagram for illustrating a configuration example of the position detecting device of the first embodiment. As shown in FIG. 2, the position detecting device of the first embodiment is composed of the position detecting sensor 1B shown in FIG. 1, a signal supply circuit 200, a signal receiving circuit 300, and a control circuit 40. The control circuit 40 is a circuit for controlling the respective parts of the position detecting device and is so configured of a microcomputer, for example.

The position detecting sensor 1B includes plural first conductors (transmitting conductors) connected to the signal supply circuit 200 and plural second conductors (receiving conductors) connected to the signal receiving circuit 300. The first conductors $11X_1$ to $11X_m$ form a transmitting conductor group 11. The second conductors $21Y_1$ to $21Y_n$ form a receiving conductor group 21.

In the following description, the first conductors $11X_1$ to $11X_m$ will be referred to collectively as the first conductor 11X and the second conductors $21Y_1$ to $21Y_n$ will be referred to collectively as the second conductor 21Y, except in the case where each conductor needs to be particularly described distinctly. The number of the first conductors 11X forming the transmitting conductor group 11 and the number of the second conductors 21Y forming the receiving conductor group 21 are suitably set depending on each embodiment, such as the size of an indication input surface 1BS of the position detecting sensor 1B to be operated by the user. In the illustrated embodiment, the side where the transmitting conductor group 11 lies is used as the indication input surface 1BS, on which an indication input is made by an indicator such as a finger of the user.

In FIG. 2, the X-axis arrow shown at the lower right portion indicates the X-axis direction and similarly the Y-axis arrow indicates the Y-axis direction. Also as described in detail later, the transmitting conductor group 11 is configured by arranging m number of elongated (flat plate shaped) first conductors 11X extended along the Y-axis direction of the position detecting sensor 1B, in the X-axis direction separated from each other with the intermediary of predetermined intervals. The receiving conductor group 21 is configured by arranging n number of elongated (flat plate shaped) second conductors 21Y extended along the X-axis direction of the position detecting sensor 1B, in the Y-axis direction separated from each other with the intermediary of predetermined intervals.

As described in detail later, the transmitting conductor group 11 is disposed to oppose the receiving conductor group 21 with the intermediary of a dielectric member and plural spacers. Due to such configuration, a capacitor is formed where each of the first conductors 11X opposes the corresponding second conductor 21Y. In the first embodiment, the first conductor 11X and the second conductor 21Y are formed by, e.g., a silver pattern, a transparent electrode film formed of an ITO (Indium Tin Oxide) film, or a copper foil.

The signal supply circuit 200 supplies a signal for enabling detection of a position indicated by an indicator on the indication input surface 1BS of the position detecting sensor 1B as well as detection of the pressing force applied at the indicated position, to each of the first conductors 11X forming the transmitting conductor group 11. The signal supply circuit 200 includes a selecting circuit 24 and a signal generating circuit 25 as shown in FIG. 2. The selecting circuit 24 selectively supplies a signal from the signal generating circuit 25 to the first conductor 11X in accordance with control from the control circuit 40. The signal generating circuit 25 generates an AC signal of a sine wave, a rectangular wave, etc. having a determined frequency in accordance with control of the control circuit 40, and supplies it to the selecting circuit 24.

The selecting circuit 24 of the present embodiment is switch-controlled by the control circuit 40 so as to supply the signal from the signal generating circuit 25 to all of the first conductors $11X_1$ to $11X_m$ in a predetermined time period. The selective supplying of the AC signal from the signal generating circuit 25 to the first conductors 11X by the selecting circuit 24 in this manner allows detection of plural indicated positions as well as the pressing force applied at the respective positions on the indication input surface 1BS.

The signal receiving circuit 300 executes signal processing for received signals obtained from the plural second conductors 21Y forming the receiving conductor group 21, to thereby detect a position indicated by an indicator on the indication input surface 1BS as well as the pressing force applied at the indicated position. As shown in FIG. 2, the signal receiving circuit 300 includes an amplifying circuit 31, an A/D (Analog/Digital) conversion circuit 32, and a detecting circuit 33 of indicated position and pressing force.

The amplifying circuit 31 amplifies the received signals obtained from the second conductors 21Y forming the receiving conductor group 21 and supplies them to the A/D conversion circuit 32. The A/D conversion circuit 32 converts the received signals from the second conductors 21Y and amplified in the amplifying circuit 31 to digital signals, and supplies them to the detecting circuit 33 of indicated position and pressing force.

When an indication input by an indicator is made to the position detecting sensor 1B, the detecting circuit 33 of indicated position and pressing force detects (identifies), based on the signals from the A/D conversion circuit 32, the indicated position on the indication input surface 1BS as well as the applied force (pressing force) at the indicated position. As described above, a capacitor is formed at a position where each of the first conductors 11X opposes the corresponding second conductor 21Y. As described in detail later, when a pressing force is applied to the position detecting sensor 1B, the contact state of various stacked elements changes between the transmitting conductor group 11, to which the pressing force is applied, and the receiving conductor group 21.

Specifically, when the position detecting sensor 1B is pressed, the contact state between the dielectric member intervening between the transmitting conductor group 11 and the receiving conductor group 21 and the transmitting conductor group 11 or the receiving conductor group 21 changes. Here, the contact state includes not only the state in which the stacked elements are in direct contact but also the state in which they come close to each other in terms of the distance. For example, when a pressing force is applied from the side of the transmitting conductor group 11 to the side of the receiving conductor group 21, the contact area of the dielectric member with the second conductor 21Y or the first conductor 11X increases.

The capacitance of the capacitor formed by each of the first conductors 11X and the corresponding second conductor 21Y changes depending on the pressing force applied thereto. Here, a dominant factor that causes such change in the capacitance is an increase in the contact area between the dielectric member and the receiving conductor group 21 or the transmitting conductor group 11 that is facing the dielectric member. Therefore, the signal (current) flowing in the second conductor 21Y increases at a position where the capacitance changes.

Accordingly, by monitoring the amount of signal (amount of current) flowing through each conductor of the plural second conductors 21Y, it is possible to detect at which position on the position detecting sensor 1B a position indication operation is performed by the indicator. Which first conductor 11X is supplied with the AC signal can be determined based on information from the control circuit 40. Based on these various pieces of information, the position (cross point) at which the first conductor 11X supplied with the AC signal from the signal generating circuit 25 intersects the second conductor 21Y in which the amount of signal changes is detected as a position indicated by the indicator. In addition, the capacitance of the capacitor changes according to the pressing operation by the indicator. Thus, by detecting the amount of signal flowing in the second conductor 21Y, the amount of pressing force applied by the indicator to the position detecting sensor 1B can also be detected.

In this manner, the detecting circuit 33 of indicated position and pressing force can detect, in addition to the position indicated by the indicator, a signal corresponding to the pressing force applied by the indicator. The indicated position and the pressing force detected by the detecting circuit 33 of indicated position and pressing force are supplied to a predetermined control circuit in the motherboard 1D and are used as input information from the user.

Configuration Examples of a Position Detecting Sensor (1B)

Figure 4A:
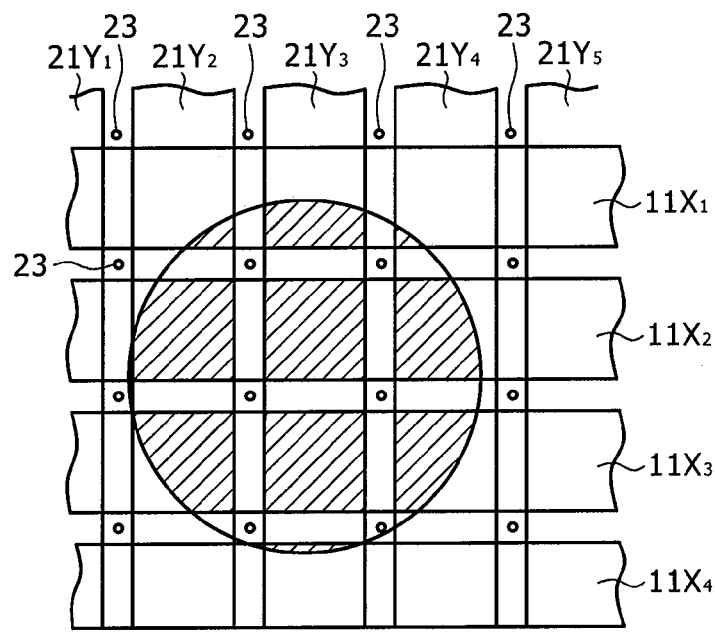
FIGS. 4A and 4B are diagrams illustrating an operational state of the position detecting sensor (1B) when a position indication operation is performed on the position detecting sensor (1B).
Figure 4B:
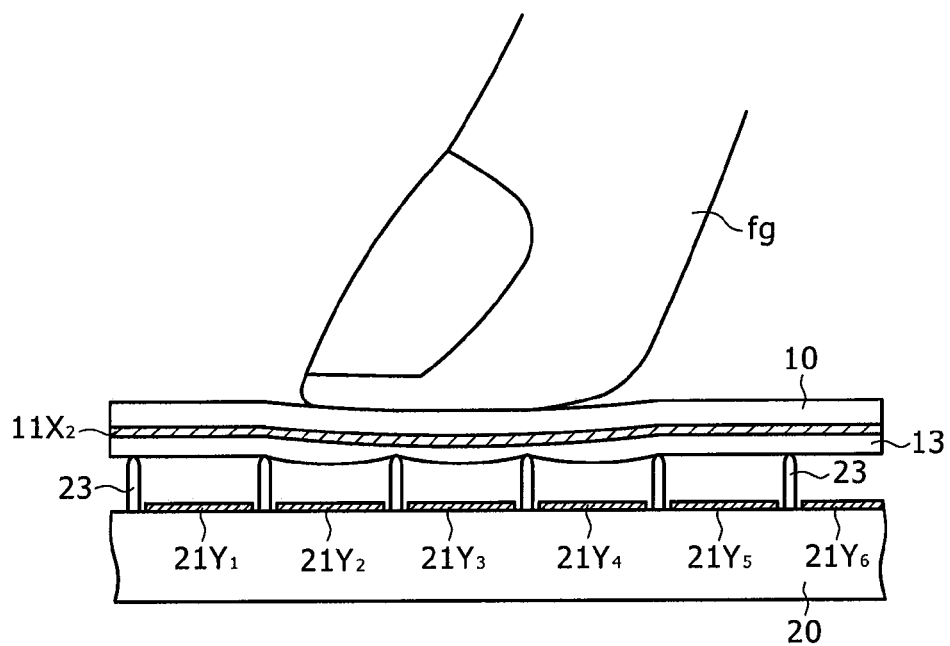
Figure 5A:
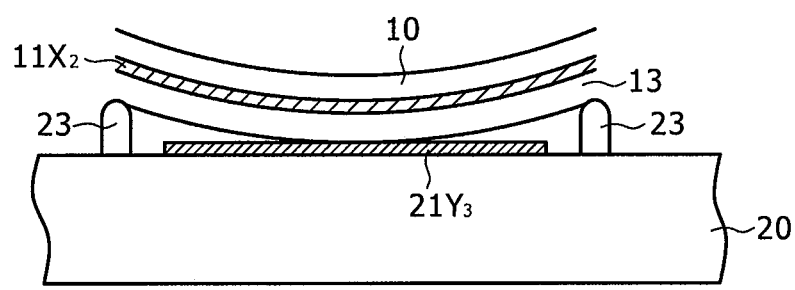
FIGS. 5A and 5B are diagrams illustrating the operation principle of various embodiments of the present invention.
Figure 5B:
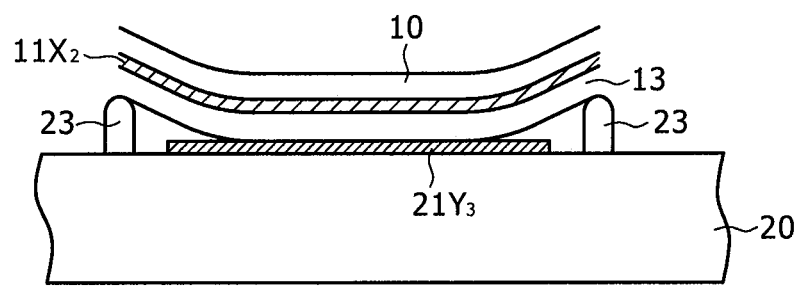

Next, a configuration example of the position detecting sensor 1B will be specifically described with reference to FIGS. 3A to 5B. FIGS. 3A to 3C are diagrams illustrating a configuration example of the position detecting sensor 1B of the first embodiment, and FIGS. 4A and 4B are diagrams illustrating an operational state of the position detecting sensor 1B when an indication input is made to the position detecting sensor 1B. FIGS. 5A and 5B are diagrams illustrating the operation principle.

As described above, the position detecting sensor 1B of the first embodiment is not a sensor, which detects a change in capacitance caused by the movement of an electric charge to the ground via the indicator (e.g., human body) as in a conventional position detecting sensor that utilizes a capacitive sensing system. The position detecting sensor 1B of the present embodiment detects a change in the capacitance between each of the first conductors 11X and the corresponding second conductor 21Y according to the pressing force applied by the indicator, using the intermediary of a dielectric member 13 having flexibility. Thus, with the position detecting sensor 1B of the present embodiment, the indicator need not be a conductor such as a finger and may be an insulator. Therefore, even when a user is wearing a rubber glove, for example, the position detecting sensor 1B can desirably detect both an indicated position as well as the pressing force applied thereto.

FIG. 3A is a front view seen from the side of the indication input surface 1BS (surface on which an indication input is made by an indicator such as a finger and a pen) of the position detecting sensor 1B. FIG. 3B is a cross-sectional view taken along line X-X of FIG. 3A and FIG. 3C is a cross-sectional view taken along line Y-Y of FIG. 3A. In the position detecting sensor 1B shown in FIGS. 3A to 3C, when seen from the side of the indication input surface 1BS, the direction in which the first conductors 11X are arranged (at intervals) is the X-axis direction and the direction in which the second conductors 21Y are arranged (at intervals) is the Y-axis direction.

As shown in FIGS. 3B and 3C, the position detecting sensor 1B of the present embodiment is configured by disposing an upper substrate (first substrate) 10 and a lower substrate (second substrate) 20 on the upper and lower sides. A surface 10a of the upper substrate 10 on the side opposite to the surface facing the lower substrate 20 serves as the indication input surface 1BS.

The upper substrate 10 is composed of a flexible material capable of bending toward the lower substrate 20 when an indicator is pressed against the indication input surface 1BS (upper surface 10a of the upper substrate 10). In this example, the upper substrate 10 is formed by a glass substrate having a relatively small thickness or a film substrate composed of a transparent synthetic resin such as PET (polyethylene terephthalate), PP (polypropylene), and LCP (liquid crystal polymer). The lower substrate 20 is composed of a glass substrate or a rigid, transparent synthetic resin in this example.

On the surface of the upper substrate 10 that is facing the lower substrate 20, m (m is an integer equal to or larger than 2) number of elongated (flat plate shaped) first conductors $11X_1, 11X_2, \ldots, 11X_m$ that each have a predetermined width Wx and are extended along the Y-axis direction are arranged in the X-axis direction with a predetermined arrangement pitch Px (>Wx). Each of the first conductors $11X_1$, $11X_2, \ldots, 11X_m$ is formed by a transparent electrode composed of ITO (Indium Tin Oxide) in this example. First connection conductors $12X_1, 12X_2, \ldots, 12X_m$ are led out from the first conductors $11X_1, 11X_2, \ldots, 11X_m$, respectively. The first connection conductors $12X_1, 12X_2, \ldots, 12X_m$ are connected to the selecting circuit 24 in the signal supply circuit 200 shown in FIG. 2, provided in the motherboard 1D.

On the surface of the lower substrate 20 facing the upper substrate 10, n (n is an integer equal to or larger than 2) number of elongated (flat plate shaped) second conductors $21Y_1, 21Y_2, \ldots, 21Y_n$ that each have a predetermined width Wy and are extended along the X-axis direction are arranged in the Y-axis direction with a predetermined arrangement pitch Py (>Wy). Each of the second conductors $21Y_1$, $21Y_2, \ldots, 21Y_n$ is formed by a transparent electrode composed of ITO (Indium Tin Oxide) in this example. Second connection conductors $22Y_1, 22Y_2, \ldots, 22Y_n$ are led out from the second conductors $21Y_1, 21Y_2, \ldots, 21Y_n$, respectively. The second connection conductors $22Y_1, 22Y_2, \ldots, 22Y_n$ are connected to the amplifying circuit 31 in the signal receiving circuit 300 shown in FIG. 2, provided in the motherboard 1D.

In the present embodiment, the widths Wx and Wy are selected such that Wx=Wy=2 to 2.5 mm for example, and the arrangement pitches Px and Py are selected such that Px=Py=3.2 mm for example. On the upper substrate 10 having flexibility, which may be formed of a glass substrate, a film substrate composed of a synthetic resin material, etc., the first conductors 11X are integrally formed with the upper substrate 10 using a known conductor forming process such as evaporation or printing. Similarly, on the lower substrate 20, which may be formed of a glass substrate, a synthetic resin substrate, etc., the second conductors 21Y are integrally formed with the lower substrate 20 using a known conductor forming process such as evaporation or printing.

On the upper substrate 10, the dielectric member 13 is so provided as to cover all of the plural first conductors $11X_1$ to $11X_m$. The dielectric member 13 is formed by a transparent dielectric film composed of a dielectric whose relative dielectric constant is about 2 to 10, such as PET (polyethylene terephthalate), PP (polypropylene), and LCP (liquid crystal polymer). The thickness of the dielectric member 13 is, e.g., 5 to 15 μm. Also, a glass material can be applied as the dielectric member 13. Additionally, the dielectric member 13 may be formed by a dielectric film (relative dielectric constant is equal to or larger than 40) that is filled with a filler material having a large dielectric constant in high density. Furthermore, as the dielectric member 13, various dielectrics having transparency, such as a transparent epoxy resin, an acrylic-based resin for photoresist, a highly optically transmissive fluorine resin, and a one-component urethane-based resin, can also be applied.

The circumferential portion of the upper substrate 10 (on which the dielectric member 13 is applied) and the circumferential portion of the lower substrate 20 are bonded to each other with the intermediary of a bonding member 30 having a frame shape such that the two are separated from each other by a predetermined gap d. Therefore, in the position detecting sensor 1B of the present embodiment, an air layer 14 exists between the surface of the lower substrate 20, on which the second conductors $21Y_1$ to $21Y_n$ are formed, and the surface of the dielectric member 13 applied on the upper substrate 10.

In the present embodiment, spacers 23 are provided on the lower substrate 20 on the surface facing the upper substrate 10 so that the upper substrate 10 (on which the dielectric member 13 is applied) and the lower substrate 20 may be separated from each other by a predetermined distance, i.e., the layer thickness of the air layer 14 may be maintained when no pressing force is applied to the indication input surface 1BS (10a). Specifically, the spacers 23 having a protrusion shape are disposed at predetermined intervals on the lower substrate 20 where the spacers 23 would not spatially overlap with the second conductors $21Y_1, 21Y_2, \ldots, 21Y_n$ or the first conductors $11X_1, 11X_2, \ldots, 11X_m$ (i.e., in gap areas between the conductors).

In this example, in the X-axis direction, the spacers 23 are arranged with the arrangement pitch Px, in between each adjacent pair of the first conductors $11X_1, 11X_2, \ldots, 11X_m$. In the Y-axis direction, the spacers 23 are arranged with the arrangement pitch Py, in between each adjacent pair of the second conductors $21Y_1, 21Y_2, \ldots, 21Y_n$. The spacers 23 are formed, e.g., by printing a transparent dielectric material, or based on a principle like ink discharging in a dot printer. The height of the spacer 23 is equal to or lower than the gap d and is, e.g., about 20 μm to 100 μm.

As a result, when the indication input surface 1BS is pressed by an indicator, the upper substrate 10 bends toward the lower substrate 20 at the positions where the first conductors $11X_1, 11X_2, \ldots, 11X_m$ and the second conductors $21Y_1, 21Y_2, \ldots, 21Y_n$ intersect each other.

Each of the plural first conductors 11X forming the transmitting conductor group 11 is sufficiently thin relative to the upper substrate 10. Thus, the first conductors 11X that exist at the position(s) where the upper substrate 10 bends also bend. The dielectric member 13 is also thinly formed in a film manner, for example, and has flexibility. Therefore, the corresponding position in the dielectric member 13 also bends in accordance with the bending of the upper substrate 10. Thus, when an indicator such as a finger or a pen presses the indication input surface 1BS, the first conductor 11X is moved closer to the second conductor 21Y such that the two are brought close to each other.

In this case, when an indication input is made to the position detecting sensor 1B by using a finger as the indicator, the area with which the finger comes into contact on the indication input surface 1BS has a substantially circular shape or elliptical shape whose diameter is about 9 mm although there are individual differences. As described above, in the position detecting sensor 1B of the present embodiment, the first conductors 11X and the second conductors 21Y each having a width of 2.0 to 2.5 mm are so arranged as to intersect each other with the arrangement pitch of 3.2 mm.

Therefore, when the finger comes into contact with the indication input surface 1BS of the position detecting sensor 1B, the pressed area is, e.g., an area like that shown by a circular shape in FIG. 4A. Specifically, in the pressed area as illustrated, three first conductors 11X adjacent to each other and three second conductors 21Y adjacent to each other are included. In the area shown by oblique lines, the upper substrate 10, the first conductors 11X, and the dielectric member 13 bend so as to come close to the second conductors 21Y.

FIG. 4B corresponds to FIG. 4A and is a Y-Y cross-sectional view of a portion of the first conductor $11X_2$ when the finger presses the indication input surface 1BS of the position detecting sensor 1B. That is, FIG. 4B is a diagram similar to the Y-Y cross-sectional view of a portion of the first conductor $11X_2$ as shown in FIG. 3C. This example schematically shows the state in which a pressing force by the finger is initially applied, centering on the position where the first conductor $11X_2$ intersects the second conductor $21Y_3$ on the indication input surface 1BS.

As shown in FIG. 4B, when the indication input surface 1BS is gradually pressed by the finger, the first conductor $11X_2$ bends at the positions facing the second conductors $21Y_2, 21Y_3,$ and $21Y_4$, respectively, and whereby the dielectric member 13 comes close to each of the second conductors $21Y_2, 21Y_3,$ and $21Y_4$. Subsequently, the dielectric member 13 comes to abut the second conductors $21Y_2, 21Y_3,$ and $21Y_4$ and, finally, the respective abutting areas (contact areas) formed between the dielectric member 13 and the second conductors $21Y_2, 21Y_3,$ and $21Y_4$ start to increase.

Here, the operation principle of the present invention will be described with reference to FIGS. 5A and 5B. In general, the capacitance C of the capacitor is given by the following equation (1):

$$\text{capacitance C of a capacitor} = \epsilon_0 S/D \tag{1}$$

In equation (1), $\epsilon_0$ is the relative dielectric constant of the dielectric intervening between the electrodes. S is the area of the opposing electrodes and D is the distance between the opposing electrodes. Here, the relative dielectric constant $\epsilon_0$ is uniquely determined by the dielectric material interposed between the electrodes.

On the lower substrate 20, the plural second conductors 21Y are disposed such that a predetermined gap (Py-Wy) is set between each of the adjacent conductors. Furthermore, the spacers 23 are so provided as to have predetermined shape and height at predetermined intervals in the areas of the gap (Py-Wy) between each of the adjacent conductors. On the upper substrate 10 having flexibility, the plural first conductors 11X having flexibility are disposed such that a predetermined gap (Px-Wx) is set between each of the adjacent conductors. The dielectric member 13, also having flexibility, abuts the upper substrate 10 so as to cover the plural first conductors 11X. The dielectric member 13 and the plural second conductors 21Y are disposed to oppose each other.

The present invention applies the principle of the capacitor shown in equation (1) and has a structure to cause a large change in the capacitance formed between the first conductor 11X and the second conductor 21Y.

Specifically, in the state in which the upper substrate 10 is not pressed by an indicator, the dielectric member 13 is separated from the second conductor $21Y_3$ by a predetermined distance due to the spacers 23.

Next, when the upper substrate 10 is pressed by the indicator in the direction from the upper substrate 10 to the lower substrate 20, as shown in FIG. 5A, the first conductor $11X_2$ comes to abut the second conductor $21Y_3$ with the dielectric member 13 interposed therebetween because the upper substrate 10, the first conductor $11X_2$, and the dielectric member 13 each have flexibility. As shown in FIG. 5B, when a further pressing force is applied by the indicator, even after the distance between the first conductor $11X_2$ and the second conductor $21Y_3$ finally reaches a predetermined value determined by the thickness of the dielectric member 13, the abutting area between the dielectric member 13 and the second conductor $21Y_3$ changes according to the pressing operation by the indicator.

That is, in the present invention, when a pressing force is applied by an indicator, a distance between the first conductor $11X_2$ and the second conductor $21Y_3$ is decreased to thereby increase the capacitance therebetween until they are brought extremely close to each other, separated only by the thickness of the dielectric member 13. Furthermore, even in such close state, the abutting area formed between the dielectric member 13 and the second conductor $21Y_3$ changes depending on the pressing force to thereby change the capacitance according to the pressing force. That is, when a pressing force is applied, the distance D in the above-described equation (1) is changed to the minimum value to thereby ensure a large capacitance. In addition, by changing S in the equation according to the pressing force in this state (where D is at the minimum value), whether or not a pressing force is present and also the magnitude of the pressing force can be detected with high sensitivity and high accuracy.

In the present embodiment, the distance (gap) D between the electrodes is set to, e.g., about 100 μm in the state in which no pressing force is applied by an indicator to the indication input surface 1BS of the position detecting sensor 1B. When a pressing force is applied by an indicator to the indication input surface 1BS of the position detecting sensor 1B, the receiving conductor group 21 and the transmitting conductor group 11 abut each other with the dielectric member 13 interposed therebetween. In this case, the area S of the abutting between the receiving conductor group 21 or the transmitting conductor group 11 and the dielectric member 13 changes according to the pressing force. As shown in FIGS. 5A and 5B, in the state in which the pressing force is applied in this manner, the receiving conductor group 21 and the transmitting conductor group 11 abut each other with the dielectric member 13 interposed therebetween, and the thickness of the dielectric member 13 becomes equivalent to the distance (gap) D between the electrodes shown in equation (1). In the present embodiment, the thickness of the dielectric member 13 is about 10 μm, for example.

Specifically, additionally referring back to FIGS. 4A and 4B, the dielectric member 13 that abuts the transmitting conductor group 11 and has a thickness of about 10 μm is in such a state as to be separated from the receiving conductor group 21 by a predetermined distance (10 μm to 60 μm), due to the spacers 23, in the state in which no pressing force is applied by an indicator to the indication input surface 1BS of the position detecting sensor 1B. When a pressing force is applied by an indicator to the indication input surface 1BS of the position detecting sensor 1B, the dielectric member 13 abuts certain one(s) of the second conductors 21Y forming the receiving conductor group 21 and the abutting area between the dielectric member 13 and the certain second conductor(s) 21Y changes according to the pressing force. In this case, because the dielectric member 13 and the certain second conductor(s) 21Y abut each other, the corresponding first conductor(s) 11X and the certain second conductor(s) 21Y come to be extremely close to each other with the dielectric member 13 having a thickness of about 10 μm interposed therebetween.

As is apparent from the above description, the present invention applies the principle of the capacitor and has a configuration to cause a large change in the capacitance formed between the first conductor 11X and the second conductor 21Y. Specifically, when a pressing force is applied by an indicator to the indication input surface 1BS of the position detecting sensor 1B, the first conductor 11X and the second conductor 21Y are brought extremely close to each other with the dielectric member 13 interposed therebetween, to thereby increase the capacitance therebetween. Furthermore, in such close state, the abutting area formed between the dielectric member 13 and the second conductor 21Y changes depending on the pressing force to thereby change the capacitance according to the pressing force. That is, when a pressing force is applied, the distance D in the above-described equation (1) is changed to the minimum value corresponding to the thickness of the dielectric member 13 to thereby ensure a large capacitance. In addition, by changing S in the equation according to the pressing force in this state (where D is at the minimum value), whether or not a pressing force is present and also the magnitude of the pressing force can be detected with high sensitivity and high accuracy.

Configuration Examples of Spacer (23)

Figure 6:
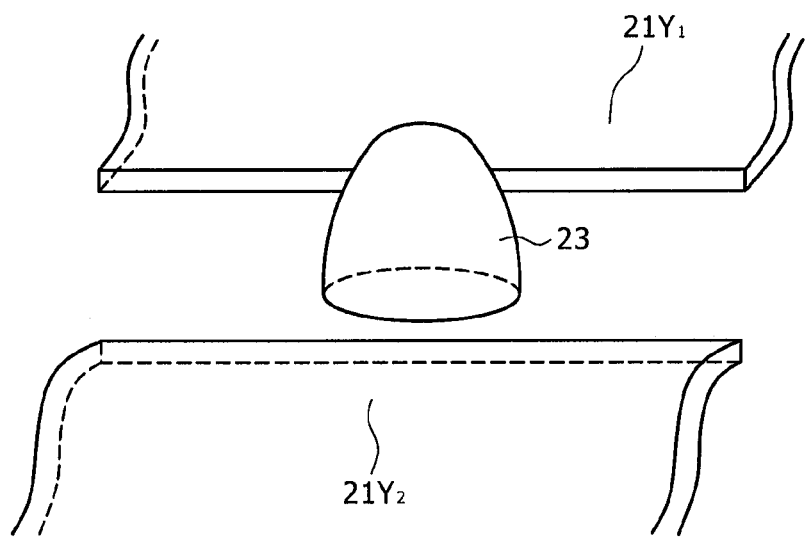
FIG. 6 is a diagram illustrating a configuration example of a spacer (23).
Figure 7:
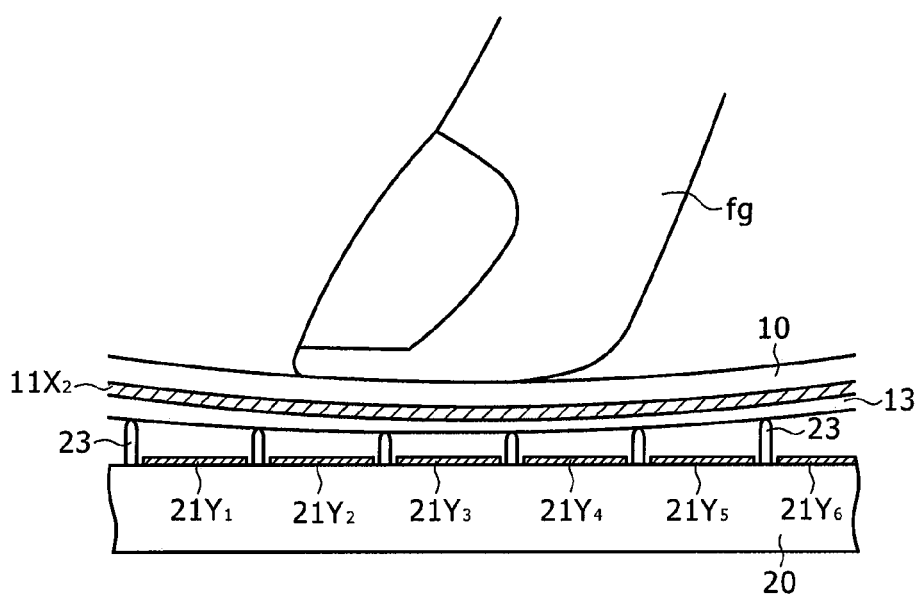
FIG. 7 is a diagram illustrating an operational state of the spacers (23) when the position detecting sensor (1B) is pressed.

FIG. 6 and FIG. 7 are diagrams illustrating a configuration example of the spacer 23. As described above, the spacers 23 are formed by printing a transparent dielectric material or spraying a dielectric material using the ink discharging principle of a dot printer, for example. Thus, as shown in FIG. 6, the spacer 23 can be obtained as an object having a hemispheric shape or a circular cylindrical shape whose head portion has a hemispheric shape. The shape of the spacer 23 is not limited to the shape shown in FIG. 6. For example, it may be formed into a circular cylindrical shape or a polygonal cylindrical shape, or may be formed into a circular conical shape or a polygonal conical shape. It may also take other various shapes.

It is also possible to form the spacers 23 with a material having elasticity, such as transparent silicone rubber, for example. The dielectric member 13 abutting the transmitting conductor group 11 is separated from the receiving conductor group 21 by a predetermined distance by the spacers 23 in the state in which no pressing force is applied by an indicator to the indication input surface 1BS of the position detecting sensor 1B.

Next, when a pressing force is applied by an indicator to the indication input surface 1BS of the position detecting sensor 1B, the upper substrate 10, the transmitting conductor group 11, and the dielectric member 13 bend and, therefore, the dielectric member 13 comes to abut the second conductor 21Y forming the receiving conductor group 21 as described above.

Specifically, as shown in FIG. 7, when a finger as an indicator presses the indication input surface 1BS of the position detecting sensor 1B, the upper substrate 10, the first conductor $11X_2$ forming the transmitting conductor group 11, and the dielectric member 13 bend. Consequently, the state is achieved in which the dielectric member 13 abuts the second conductor 21Y forming the receiving conductor group 21. In this abutting state, the abutting area (contact area) between the dielectric member 13 and the second conductor 21Y forming the receiving conductor group 21 changes according to the pressing force. Based on this configuration, an indicated position on the indication input surface 1BS as well as the pressing force applied at the indicated position can be detected with high sensitivity and high accuracy. In FIG. 7, the spacers 23 have elasticity such that they are elastically deformed according to the pressing force of the finger.

Figure 8:
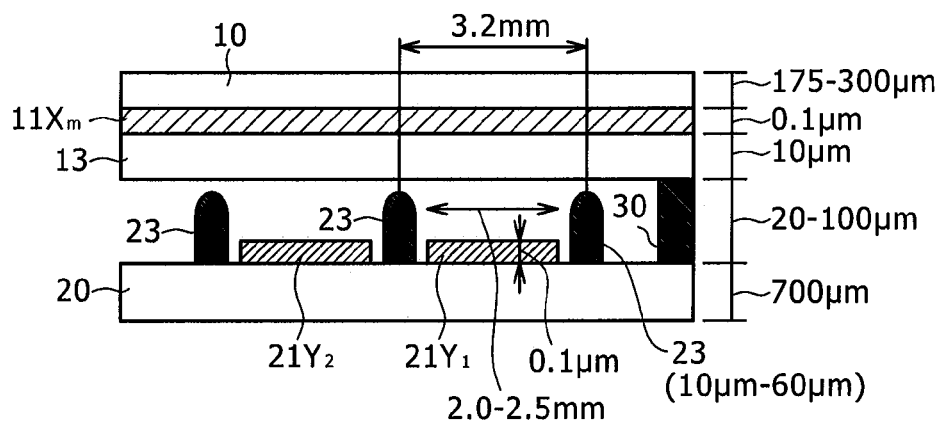
FIG. 8 is a diagram illustrating a portion (right end part) of a Y-Y cross-sectional view of the position detecting sensor (1B).

Summary of the Configuration of a Position Detecting Sensor (1B) of the First Embodiment Next, the basic configuration of the position detecting sensor 1B of the first embodiment will be summarized. FIG. 8 is a diagram showing a portion of a Y-Y cross-sectional view of (a right end portion of) the position detecting sensor 1B, similarly to the Y-Y cross-sectional view of FIG. 3C.

As described with reference to FIGS. 3A to 3C, in the position detecting sensor 1B of the first embodiment, on the surface of the upper substrate 10 opposing the lower substrate 20, the plural first conductors (transmitting conductors) 11X that are extended along the Y-axis direction and have the predetermined width Wx are arranged in the X-axis direction at the predetermined pitch Px. Furthermore, the dielectric member 13 is provided to abut so as to cover the plural first conductors 11X (transmitting conductor group 11). On the other hand, on the surface of the lower substrate 20 opposing the upper substrate 10, the plural second conductors (receiving conductors) 21Y that are extended along the X-axis direction and have the predetermined width Wy are arranged in the Y-axis direction at the predetermined pitch Py. Furthermore, on the surface of the upper substrate 10 opposing the lower substrate 20, the predetermined gap (Px-Wx) is provided between each pair of the conductors forming the plural first conductors 11X as shown in FIG. 3A. Similarly, on the surface of the lower substrate 20 opposing the upper substrate 10, the predetermined gap (Py-Wy) is provided between each pair of the conductors forming the plural second conductors 21Y. In this example, the spacers 23 are disposed at predetermined intervals at positions where the gaps are provided between each pair of the conductors forming the plural second conductors 21Y on the lower substrate 20 and that do not spatially overlap with the first conductors 11X.

The upper substrate 10 abuts the dielectric member 13 with the plural first conductors 11X interposed therebetween, and the lower substrate 20 includes the plural second conductors 21Y and the spacers 23 disposed thereon. The upper substrate 10 and the lower substrate 20 are bonded to each other by the bonding member 30 at the respective circumferential portions. Consequently, the position detecting sensor 1B with a laminated structure like that shown in FIG. 8 is formed.

One example of the thicknesses of the respective elements shown in FIG. 8 is as follows. The thickness of the upper substrate 10 is, e.g., about 175 μm to 300 μm. The thickness of the first conductor 11X is, e.g., about 0.1 μm. The thickness of the dielectric member 13 is, e.g., about 10 μm. Furthermore, the thickness of the lower substrate 20 is, e.g., about 700 μm and the thickness of the second conductor 21Y is, e.g., about 0.1 μm. In addition, the height of the spacer 23 is, e.g., about 10 μm to 60 μm and the diameter of the surface of the spacer abutting the lower substrate 20 is, e.g., about 50 μm. The distance (gap) d from the lower substrate 20 to the dielectric member 13 is, e.g., about 20 μm to 100 μm, depending in part on the height of the spacer 23. Although the thickness of the first conductor 11X and the second conductor 21Y is extremely thin, they are shown with a large thickness in the diagram in order to clearly show their relative positions. Furthermore, the spacers 23, which abut the dielectric member 13 in reality, are shown in a stated separated from the dielectric member 13 in various diagrams solely for clarity purposes.

In the position detecting sensor 1B of the first embodiment, the width of both the first conductor 11X and the second conductor 21Y is, e.g., about 2.0 mm to 2.5 mm, and the provision pitch of the spacer 23 is, e.g., about 3.2 mm. All of the thicknesses, height, width, arrangement pitch, gap distance, and so forth of the respective elements explained here are one example and can be adjusted according to each application.

Modification Examples of a Position Detecting Sensor (1B) of the First Embodiment Various modifications are possible with respect to the position detecting sensor 1B of the first embodiment having the basic configuration shown in FIG. 8. FIGS. 9A to 10D are diagrams illustrating modification examples of the position detecting sensor 1B of the first embodiment. In FIGS. 9A to 10D, the parts configured similarly to the respective parts shown in FIG. 8 are given the same reference numerals and description thereof is omitted.

Figure 9A:
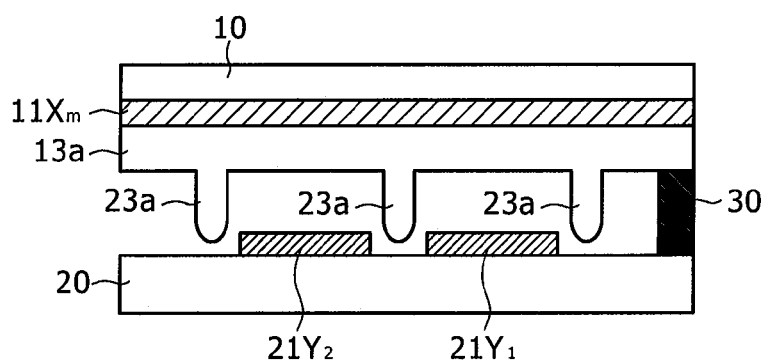
FIGS. 9A and 9B are diagrams illustrating modification examples of the position detecting sensor (1B).

In a position detecting sensor shown in FIG. 9A, a dielectric member 13a, on which spacers 23a are integrally formed, abuts the upper substrate 10 with the plural first conductors 11X interposed therebetween and opposes the lower substrate 20. On the other hand, in a position detecting sensor shown in FIG. 9B, spacers 23b are provided on the dielectric member 13 to oppose the lower substrate 20, in place of the spacers 23 provided on the lower substrate 20 in FIG. 8.

Figure 9B:
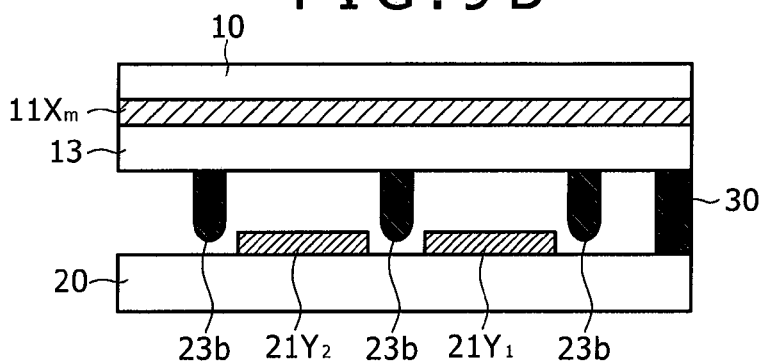

Comparing FIG. 9A and FIG. 9B, the spacers 23a in FIG. 9A are integrally formed with the dielectric member 13a, whereas the spacers 23b in FIG. 9B are provided as separate elements from the dielectric member 13. Therefore, in the position detecting sensor shown in FIG. 9B, it is possible to form the dielectric member 13 and the spacers 23b from different materials. The positions at which the spacers 23a and 23b are disposed in the position detecting sensors shown in FIGS. 9A and 9B are the same as those in the case of the position detecting sensor 1B of the first embodiment, as shown in FIG. 8 for example.

Figure 10A:
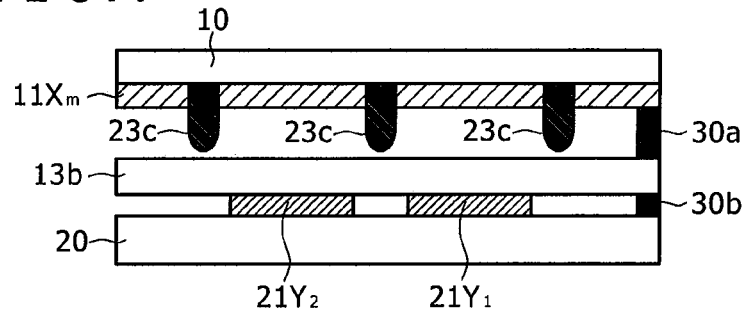
FIGS. 10A to 10D are diagrams illustrating further modification examples of the position detecting sensor (1B).

In the position detecting sensor shown in FIG. 10A, a dielectric member 13b is so provided as to cover the plural second conductors 21Y, which are provided as receiving conductors on the surface of the lower substrate 20 opposing the upper substrate 10. On the upper substrate 10 on which the plural first conductors 11X are provided as transmitting conductors, spacers 23c are provided to oppose the dielectric member 13b.

Figure 10B:
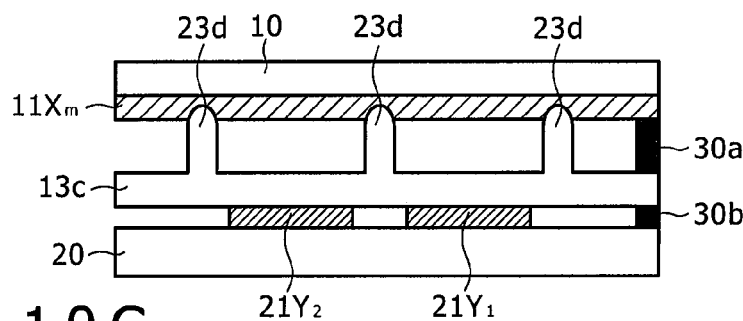

In a position detecting sensor shown in FIG. 10B, a dielectric member 13c, with which spacers 23d are integrally formed, is so provided as to cover the plural second conductors 21Y, which are provided as receiving conductors on the surface of the lower substrate 20 opposing the upper substrate 10. On the upper substrate 10, the plural first conductors 11X are provided as transmitting conductors to oppose the lower substrate 20. Alternatively, the spacers 23d may be provided as elements separate from the dielectric member 13c, similarly to the case of the position detecting sensor shown in FIG. 9B. If the spacers 23d are provided as separate elements, the dielectric member 13c and the spacers 23d can be formed from different materials.

Figure 10C:
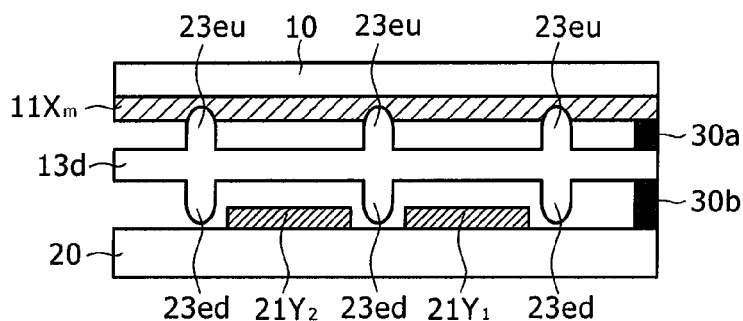

In a position detecting sensor shown in FIG. 10C, the plural first conductors 11X are disposed on the upper substrate 10 and the plural second conductors 21Y are disposed on the lower substrate 20. A dielectric member 13d is disposed between the upper substrate 10 and the lower substrate 20. On the dielectric member 13d, spacers 23eu are integrally provided to oppose the upper substrate 10. Additionally, spacers 23ed are integrally provided on the dielectric member 13d to oppose the lower substrate 20. Therefore, a predetermined distance is formed between the plural first conductors 11X and the plural second conductors 21Y by the spacers 23eu and 23ed. Thus, the plural first conductors 11X disposed on the upper substrate 10 and the plural second conductors 21Y disposed on the lower substrate 20 come to abut each other, with the dielectric member 13d interposed therebetween, according to a pressing force of a finger or the like. Furthermore, the abutting areas between the plural first conductors 11X and the dielectric member 13d and the abutting areas between the plural second conductors 21Y and the dielectric member 13d change according to the pressing force. Although the dielectric member 13d and each of the spacers 23eu and 23ed are integrally formed in FIG. 10C, it is also possible to form them as elements that are separate from each other.

Figure 10D:
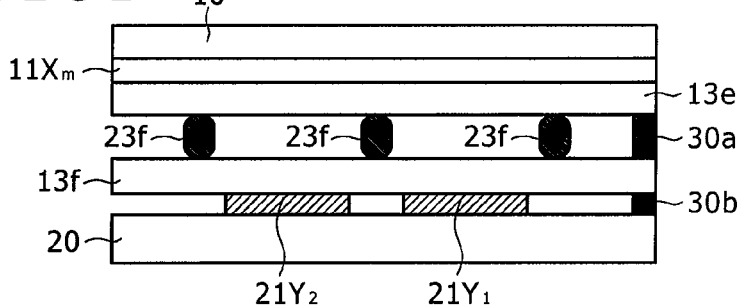

In a position detecting sensor shown in FIG. 10D, a first dielectric member 13e is provided on the upper substrate 10, on which the plural first conductors 11X are disposed, in such a manner as to cover the plural first conductors 11X. Similarly, a second dielectric member 13f is provided on the lower substrate 20, on which the plural second conductors 21Y are disposed, in such a manner as to cover the plural second conductors 21Y. Further, spacers 23f are provided between the first dielectric member 13e and the second dielectric member 13f. Therefore, the dielectric member 13e and the dielectric member 13f come to abut each other according to a pressing force of a finger or the like. In addition, the abutting area between the dielectric member 13e and the dielectric member 13f changes according to the pressing force. Also with the position detecting sensor shown in FIG. 10D, it is possible to integrally form the first dielectric member 13e, the second dielectric member 13f, and the spacers 23f.

In the position detecting sensors of four forms shown in FIGS. 10A to 10D, the spacers 23c, 23d, 23eu, 23ed, and 23f are disposed at positions similar to those in the case of the position detecting sensor 1B of the first embodiment as shown in FIG. 8 for example. Furthermore, also in FIGS. 10A to 10D, bonding members 30a and 30b are used to bond the upper substrate 10 and the lower substrate 20.

Second Embodiment

Configuration Examples of a Position Detecting Sensor (1BX)

Figure 11:
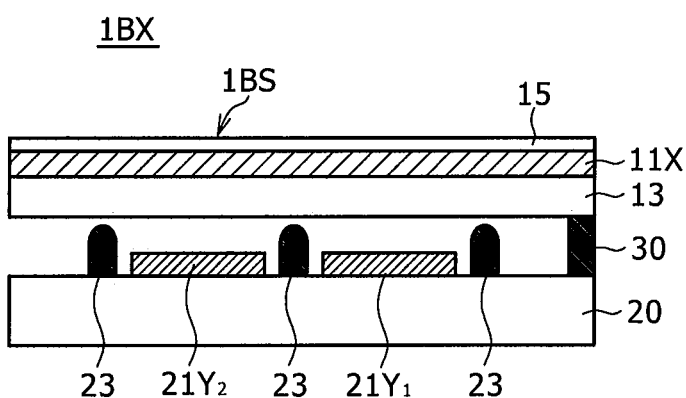
FIG. 11 is a sectional view of a position detecting sensor (1BX) of a second embodiment.

Next, a position detecting sensor 1BX of a second embodiment will be described. FIG. 11 is a sectional view illustrating the position detecting sensor 1BX of the second embodiment. The position detecting sensor 1BX of the second embodiment is characterized by that the dielectric member 13 having flexibility is made to function also as the upper substrate 10, on which the plural first conductors 11X are disposed.

As shown in FIG. 11, in the position detecting sensor 1BX of the second embodiment, the plural first conductors 11X are disposed on one surface of the dielectric member 13 having flexibility. Furthermore, a protective layer 15 having flexibility is provided on the plural first conductors 11X such that the plural first conductors 11X are protected from input operation of an indicator when the user performs position indication with the indicator on the indication input surface 1BS. Therefore, the position detecting sensor 1BX has a structure, in which the protective layer 15 is provided over one surface of the dielectric member 13 with the plural first conductors 11X interposed therebetween. The plural second conductors 21Y and the spacers 23 are provided on the lower substrate 20 as described above. The other surface of the dielectric member 13 is opposing the lower substrate 20.

In the position detecting sensor 1BX of the second embodiment, the dielectric member 13 functions as the upper substrate 10. As the material therefor, e.g., a glass substrate having optical transparency, which has been described as a sample material for the upper substrate 10, may be used. This is possible because a glass material has a relatively large dielectric constant and therefore is suitable to be used as a dielectric. If a glass material is employed as the dielectric member 13, the dielectric member 13 may function as a sensor substrate, on which sensor conductors, i.e. the plural first conductors 11X in this example, are integrally formed on the glass substrate by evaporation, printing, etc., and which has a thickness that is set so thin that the sensor substrate has flexibility. As described above, the thickness of the dielectric member 13 formed of a glass material is, e.g., about 175 μm to 300 μm similar to the upper substrate 10, and the thickness of the first conductors 11X themselves is also, e.g., about 0.1 μm and, therefore, both of the thicknesses are extremely thin. The thickness of the protective layer 15 is also extremely thin.

It is apparent that the dielectric member 13 is not limited to a glass material. For example, it is also possible to use a film-like synthetic resin having optical transparency, as described above. If a film-like synthetic resin is used as the dielectric member 13, a film-like sensor substrate can be obtained by integrally forming sensor conductors, i.e., the plural first conductors 11X in this example, on a film substrate of, e.g., PET (polyethylene terephthalate), PP (polypropylene), or LCP (liquid crystal polymer). If a material (substrate) obtained by integrally forming the sensor conductors on a synthetic resin substrate is used as the dielectric member 13, and its thickness is extremely thin, the dielectric member 13 may have flexibility that is greater than necessary. In this case, flexibility of the overall structure composed of the dielectric member 13, the plural first conductors 11X, and the protective layer 15 can be properly set based on selective use of a material having moderate flexibility, such as a glass substrate, to form the protective layer 15, for example. It is also possible to form the protective layer 15 from a synthetic resin having optical transparency instead of a glass material.

Therefore, in the state in which no pressing force is applied by an indicator to the indication input surface 1BS of the position detecting sensor 1BX, the dielectric member 13 abutting the transmitting conductor group 11 is separated from the receiving conductor group 21 by a predetermined distance by the spacers 23.

Next, when a pressing force is applied by an indicator to the indication input surface 1BS of the position detecting sensor 1BX, the protective layer 15, the transmitting conductor group 11, and the dielectric member 13 bend, as described above. Consequently, the dielectric member 13 comes to abut the second conductor 21Y forming the receiving conductor group 21. Specifically, when a finger as the indicator presses the indication input surface 1BS of the position detecting sensor 1BX, the protective layer 15, the transmitting conductor group 11, and the dielectric member 13 bend. Consequently, the dielectric member 13 eventually comes to abut the second conductor 21Y forming the receiving conductor group 21. Then, in the state in which the first conductor 11X and the second conductor 21Y are close to each other and separated by the thickness of the dielectric member 13, the abutting area between the dielectric member 13 and the second conductor 21Y forming the receiving conductor group 21 changes according to the pressing force.

In FIG. 11, the spacers 23 are provided on the side of the lower substrate 20. However, as described above, it is also possible to integrally form the spacers 23 with the lower substrate 20, or to form the spacers 23 on the dielectric member 13 either separately or integrally with the dielectric member 13.

Figure 12A:
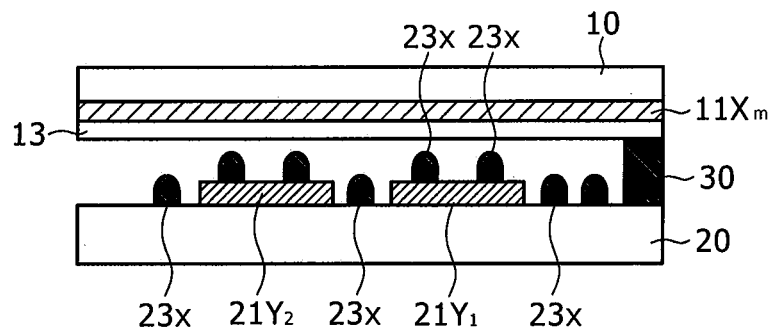
FIGS. 12A and 12B are diagrams illustrating modification examples of the position detecting sensors (1B) and (1BX).
Figure 12B:
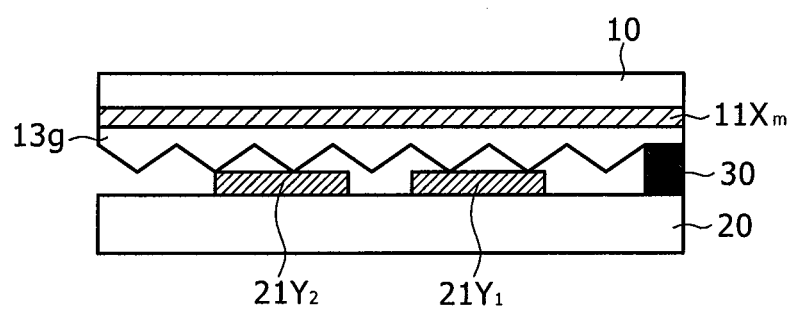
Figure 13:
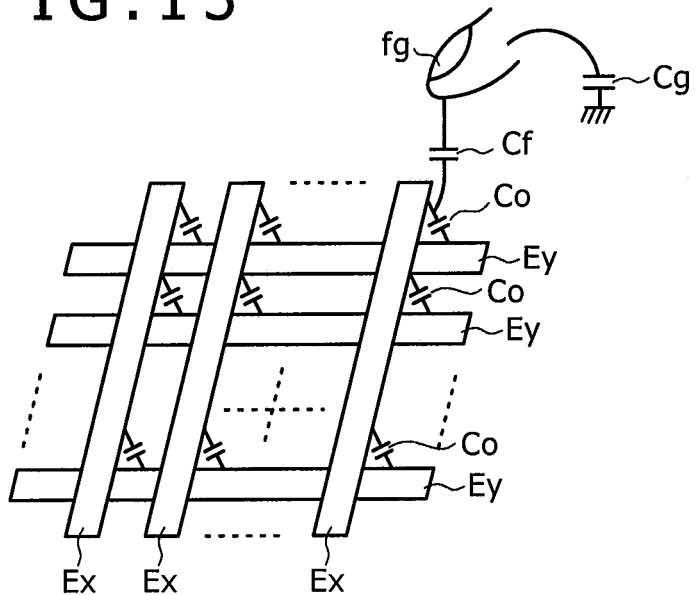
FIG. 13 is a diagram schematically illustrating a configuration of a sensor part of an indicator-detecting device that utilizes a cross-point capacitive sensing system.
Figure 14A:
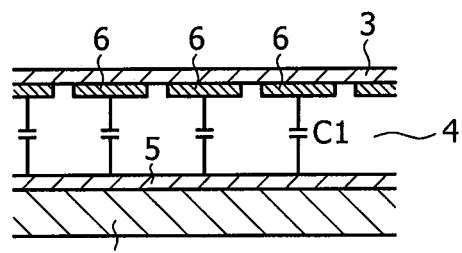
FIGS. 14A to 14C are diagrams illustrating one example of a conventional position detecting sensor.
Figure 14B:
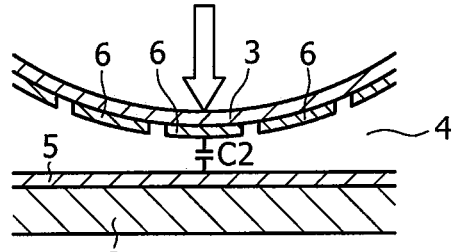
Figure 14C:
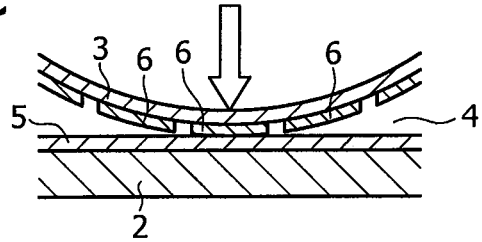

Modification Examples of Position Detecting Sensors (1B) and (1BX) of the First and Second Embodiments FIGS. 12A and 12B are diagrams illustrating modification examples of the position detecting sensors 1B and 1BX of the first and second embodiments. In the position detecting sensors 1B and 1BX of the above-described first and second embodiments, the spacers 23 and the spacers 23a to 23f are provided in areas that do not overlap with the first conductor 11X and the second conductor 21Y. However, other configurations are possible.

For example, as shown in FIG. 12A, spacers 23x may be provided on a conductor, e.g., on the second conductor 21Y. The spacers 23x may be provided also at a position where the first conductor 11X opposes the second conductor 21Y. In this case, the size and height of the spacer 23x are variously adjusted according to each application.

It is also possible to provide a dielectric member 13g shown in FIG. 12B. One surface of the dielectric member 13g abuts the upper substrate 10 with the transmitting conductor group 11 interposed therebetween. The other surface of the dielectric member 13g that opposes the lower substrate 20 has a surface shape in which a large number of recesses and projections are provided. In this case, the large number of recesses and projections provided on the surface of the dielectric member 13g opposing the lower substrate 20 function as the above-described spacers. When pressing is not performed by an indicator such as a finger, the projections formed in the dielectric member 13g abut the lower substrate 20 and the second conductor 21Y, each with a very small contact (abutting) area. When pressing is performed by an indicator such as a finger, the dielectric member 13g elastically deforms. Consequently, the projections formed in the dielectric member 13g are brought closer to the lower substrate 20 and the second conductor 21Y, and the abutting areas between the projections formed in the dielectric member 13g and the lower substrate 20 and the second conductor 21Y start to increase.

Other Modification Examples

The arrangement relationship may be interchanged between the first conductor 11X and the second conductor 21Y. Furthermore, the dielectric member provided between the transmitting conductor group 11 and the receiving conductor group 21 can be configured as an element having an extremely thin shape expressed as a film, a sheet, etc. In order to have the dielectric member abut the transmitting conductor group 11 or the receiving conductor group 21, it is also possible to firmly fix them to each other by various methods such as coating, printing, spraying, fusion bonding, or via an adhesive material. It is possible to provide plural through-holes having a predetermined shape in the dielectric member. It is also possible to dispose the spacers such that they penetrate through those through-holes.

In the above-described embodiments, the dielectric member is so provided as to cover the entire surface of the transmitting conductor group 11 or the receiving conductor group 21. However, it is not necessary that the dielectric member covers the entire surface.

Basically, the lower substrate 20 does not need to have flexibility. However, it is also possible to form the lower substrate 20 as having flexibility, such as a film-like substrate.

To form the spacer, both a material having flexibility and a material that does not have flexibility can be employed. Furthermore, the spacers may be provided in an elongated shape along the first conductor in a gap area formed between the first conductors 11X, and may be provided in an elongated shape along the second conductor in a gap area formed between the second conductors 21Y.

In the above-described embodiments, the position detecting sensors 1B and 1BX are provided on top of the display screen side of the LCD 1C and, therefore, the respective parts forming the position detecting sensors 1B and 1BX are formed as optically transmissive elements (transparent elements). However, other configurations are possible. For example, if a tablet-type position input device that does not include a display device, such as a LCD or an organic EL display, is used in connection with a personal computer or the like, the position detecting sensors 1B and 1BX do not need to be formed of optically transmissive materials (transparent materials).

Effects of Embodiments

The conventional position detecting sensor that utilizes the capacitive sensing system detects a change in capacitance caused by movement of an electric charge to the ground via an indicator such as a finger. In contrast, the position detecting sensors 1B and 1BX of the above-described embodiments detect a change in the self-capacitance of the capacitor, which is formed by the first conductor 11X and the second conductor 21Y. Thus, with the position detecting sensors 1B and 1BX of the above-described embodiments, the indicator does not need to be an object having electrical conductivity. For example, detection can be properly carried out even when an indication input is made by using an insulator such as rubber as the indicator. Therefore, the position detecting sensors 1B and 1BX of the above-described embodiments can greatly increase the application range of the position detecting sensor. Specifically, they can be utilized even in a workshop, an operating room, etc. in which the user performs various tasks with a rubber glove. Furthermore, the position detecting sensors 1B and 1BX of the above-described embodiments can increase the change width (dynamic range) of the capacitance of the capacitor formed by the first conductor 11X and the second conductor 21Y. Consequently, a position detecting sensor with high sensitivity can be realized. In one example according to an experiment, the initial capacitance of the capacitor formed by the first conductor 11X and the second conductor 21Y is about 1.4 pF in the state in which the above-described position detecting sensors 1B and 1BX are not pressed by an indicator. In contrast, in the state in which they are pressed by an indicator, the capacitance of the capacitor formed by the first conductor 11X and the second conductor 21Y becomes about 8.4 pF. Therefore, the change range is 8.4−1.4=7.0 pF and, therefore, the capacitance can be greatly changed as compared with the conventional position detecting sensor of the capacitive type.

In the position detecting sensors 1B and 1BX according to various embodiments of the present invention, the capacitance of the capacitor formed by the first conductor 11X and the second conductor 21Y changes according to the pressing force of an indicator. Thus, the pressing force can be detected with high accuracy based on the change in the capacitance.

Moreover, by properly selecting the thickness and relative dielectric constant of the dielectric member, which is interposed between the first conductor 11X and the second conductor 21Y, the change characteristics of the capacitance of the capacitor formed by the first conductor 11X and the second conductor 21Y can be desirably set according to each application.

The invention claimed is:

1. A position detecting sensor that utilizes a capacitive sensing system, the position detecting sensor including a plurality of first conductors disposed in a first direction and a plurality of second conductors disposed in a direction that intersects the first direction, the position detecting sensor being configured to detect a position indicated by an indicator by detecting a change in capacitance between the first conductor and the second conductor caused by a position indication operation of the indicator, a capacitor formed between the first conductor and the second conductor being defined by four corners, wherein:

the plurality of first conductors have flexibility;
a dielectric member having flexibility is provided between the plurality of first conductors and the plurality of second conductors, a first surface of the dielectric member abutting the plurality of first conductors or the plurality of second conductors;
for each capacitor, two, three or four spacers are provided outside two, three, or four of the four corners that define the capacitor without touching each other and without overlapping with the capacitor, to define a space between, a second surface of the dielectric member that does not abut the plurality of second conductors or the plurality of first conductors, and the other of the plurality of first conductors or the plurality of second conductors, to which the dielectric member does not abut and which faces the second surface of the dielectric member; and
an abutting area between the second surface of the dielectric member having flexibility and the plurality of second conductors or the plurality of first conductors that face the second surface is changed when the plurality of first conductors are pressed in connection with a position indication operation of the indicator to thereby cause a change in the capacitance between the plurality of first conductors and the plurality of second conductors with the flexible dielectric member interposed therebetween.

2. The position detecting sensor that utilizes a capacitive sensing system according to claim 1, wherein the first surface of the dielectric member having flexibility abuts the plurality of first conductors, and the second surface of the dielectric member having flexibility is separated from the plurality of second conductors by the space defined by the spacers.

3. The position detecting sensor that utilizes a capacitive sensing system according to claim 1, wherein the first surface of the dielectric member having flexibility is separated from the plurality of first conductors by the space defined by the spacers, and the second surface of the dielectric member having flexibility abuts the plurality of second conductors.

4. The position detecting sensor that utilizes a capacitive sensing system according to claim 1, wherein the dielectric member having flexibility is so disposed as to abut the plurality of first conductors, a second dielectric member is so disposed as to abut the plurality of second conductors, and an abutting area between the dielectric member having flexibility and the second dielectric member is changed when the plurality of first conductors are pressed in connection with a position indication operation of the indicator to thereby cause a change in the capacitance between the plurality of first conductors and the plurality of second conductors with both the dielectric member having flexibility and the second dielectric member interposed therebetween.

5. The position detecting sensor that utilizes a capacitive sensing system according to claim 1, further comprising a first substrate having flexibility, on which the plurality of first conductors are disposed, and a second substrate, on which the plurality of second conductors are disposed.

6. The position detecting sensor that utilizes a capacitive sensing system according to claim 5, wherein the spacers are disposed in areas between the plurality of first conductors disposed on the first substrate.

7. The position detection sensor that utilizes a capacitive sensing system according to claim 5, wherein the spacers are disposed in areas between the plurality of second conductors disposed on the second substrate.

8. The position detecting sensor that utilizes a capacitive sensing system according to claim 1, wherein the spacers each have a concave shape and are disposed on the second substrate.

9. The position detecting sensor that utilizes a capacitive sensing system according to claim 1, wherein the dielectric member is a film.

10. The position detecting sensor that utilizes a capacitive sensing system according to claim 1, wherein the dielectric member is fixed to the plurality of first conductors disposed in the first direction or to the plurality of second conductors disposed in the direction that intersects the first direction.

11. The position detecting sensor that utilizes a capacitive sensing system according to claim 10, wherein the dielectric member is coated or printed to the plurality of first conductors disposed in the first direction or the plurality of second conductors disposed in the direction that intersects the first direction.

12. The position detecting sensor that utilizes a capacitive sensing system according to claim 1, wherein the plurality of first conductors, the plurality of second conductors, and the dielectric member each have optical transparency.

13. The position detecting sensor that utilizes a capacitive sensing system according to claim 1, wherein the dielectric member is formed of a material selected from a group consisting of a glass material and a resin material.

14. A position detecting device including the position detecting sensor that utilizes a capacitive sensing system according to claim 1, the position detecting device further including an alternating current signal supply circuit configured to supply a determined alternating current signal to the plurality of first conductors or the plurality of second conductors, and a signal receiving circuit configured to receive a signal from the other of the plurality of first conductors or the plurality of second conductors, to which the alternating current signal is not supplied, to detect a change in the capacitance between the first conductor and the second conductor caused by a position indication operation of the indicator to thereby detect a position indicated by the indicator on the position detecting sensor.

15. A position and pressure detecting method for use with a position detecting sensor that utilizes a capacitive sensing system, the position detecting sensor including a plurality of first conductors disposed in a first direction and a plurality of second conductors disposed in a direction that intersects the first direction to thereby form a plurality of capacitors at cross-points where the plurality of first conductors intersect the plurality of second conductors, respectively, each capacitor being defined by four corners, the position detecting sensor being configured to allow detection of a change in capacitance at each of the plurality of capacitors, and the position detecting sensor further including a flexible dielectric member interposed between the plurality of first conductors and the plurality of second conductors and two, three, or four spacers disposed outside two, three, or four of the four corners that define each capacitor, without touching each other and without overlapping with the capacitor, to define a space between one surface of the dielectric member and the plurality of first conductors or the plurality of second conductors that said one surface of the dielectric member is facing, the position and pressure detecting method comprising:
detecting position(s) of one or more of the first conductors that are brought closer to the corresponding ones of the second conductors until they are separated from each other by a thickness of the dielectric member based on detection of a change in capacitance at each of the capacitors formed by said one or more of the first conductors and the corresponding ones of the second conductors caused by a decreasing distance between said one or more of the first conductors and the corresponding ones of the second conductors; and detecting a pressing force applied either to said one or more of the first conductors or to the corresponding ones of the second conductors based on detection of a change in capacitance at each of the capacitors formed by said one or more of the first conductors and the corresponding ones of the second conductors caused by an increasing abutting area between said one surface of the flexible dielectric member and each of said one or more of the first conductors or the corresponding ones of the second conductors facing said one surface of the flexible dielectric member.

16. The position detecting method according to claim 15, further comprising detecting a pressing force applied either to said one or more of the first conductors or to the corresponding ones of the second conductors based on detection of a change in capacitance at each of the capacitors formed by said one or more of the first conductors and the corresponding ones of the second conductors caused by a decreasing distance between said one or more of the first conductors and the corresponding ones of the second conductors.

17. A position detecting sensor that utilizes a capacitive sensing system, the position detecting sensor comprising:
a plurality of first conductors disposed in a first direction and a plurality of second conductors disposed in a direction that intersects the first direction to thereby form a plurality of capacitors at cross-points where the plurality of first conductors intersect the plurality of second conductors, respectively, each capacitor being defined by four corners, either or both of the first conductors and the second conductors having flexibility;
a flexible dielectric member interposed between the plurality of first conductors and the plurality of second conductors; and
for each capacitor, two, three or four spacers disposed outside two, three, or four of the four corners that define the capacitor, without touching each other and without overlapping with the capacitor, to define a space between one surface of the dielectric member and the plurality of first conductors or the plurality of second conductors that said one surface of the dielectric member is facing;
wherein the position detecting sensor is configured such that, when a pressing force is applied either to one or more of the first conductors or to the corresponding ones of the second conductors, (i) said one or more of the first conductors and the corresponding ones of the second conductors become closer to each other until they are separated from each other by a thickness of the dielectric member, to thereby change a capacitance of each of the capacitors formed by said one or more of the first conductors and the corresponding ones of the second conductors, and (ii) an abutting area increases between said one surface of the flexible dielectric member and each of said one or more of the first conductors or the corresponding ones of the second conductors facing said one surface of the flexible dielectric member, to thereby change the capacitance of each of the capacitors formed by said one or more of the first conductors and the corresponding ones of the second conductors.

18. The position detecting sensor according to claim 17, wherein the spacers are integrally formed with said one surface of the flexible dielectric member.

19. The position detecting sensor according to claim 17, wherein the spacers are disposed on both surfaces of the flexible dielectric member so as to define a first space between one surface of the dielectric member and the plurality of first conductors and to define a second space between another surface of the dielectric member and the plurality of second conductors.

* * * * *